US012601941B2

(12) United States Patent
Chan

(10) Patent No.: US 12,601,941 B2
(45) Date of Patent: Apr. 14, 2026

(54) SCREEN COVER PLATE, DISPLAY APPARATUS, AND ELECTRONIC DEVICE

(71) Applicant: Huawei Technologies Co., Ltd., Shenzhen (CN)

(72) Inventor: Chi Shun Chan, Osaka (JP)

(73) Assignee: Huawei Technologies Co., Ltd., Shenzhen (CN)

( * ) Notice: Subject to any disclaimer, the term of this patent is extended or adjusted under 35 U.S.C. 154(b) by 266 days.

(21) Appl. No.: 18/324,345

(22) Filed: May 26, 2023

(65) Prior Publication Data
US 2023/0311462 A1 Oct. 5, 2023

Related U.S. Application Data

(63) Continuation of application No. PCT/CN2020/132195, filed on Nov. 27, 2020.

(51) Int. Cl.
| | |
|---|---|
| *B32B 7/12* | (2006.01) |
| *B32B 7/022* | (2019.01) |
| *B32B 27/08* | (2006.01) |
| *B32B 27/28* | (2006.01) |
| *B32B 27/34* | (2006.01) |

(Continued)

(52) U.S. Cl.
CPC ........ *G02F 1/133331* (2021.01); *B32B 7/022* (2019.01); *B32B 7/12* (2013.01); *B32B 27/08* (2013.01); *B32B 27/281* (2013.01); *B32B 27/34* (2013.01); *B32B 37/12* (2013.01); *B32B 2250/02* (2013.01); *B32B 2250/24* (2013.01); *B32B 2255/10* (2013.01); *B32B 2255/26* (2013.01); *B32B 2307/412* (2013.01); *B32B 2307/54* (2013.01); *B32B 2307/546* (2013.01);

(Continued)

(58) Field of Classification Search
CPC . B65H 29/54; B32B 2250/02; B32B 2250/24; B32B 2255/10; B32B 2255/26; B32B 2307/412; B32B 2307/54; B32B 2307/546; B32B 2307/7376; B32B 2457/20; B32B 27/08; B32B 27/10; B32B 27/281; B32B 27/34; B32B 37/12; B32B 7/02; B32B 7/022; B32B 7/12; G02F 1/133305; G02F 1/133331; G02F 2202/28; H10K 59/872
See application file for complete search history.

(56) References Cited

U.S. PATENT DOCUMENTS

| | | |
|---|---|---|
| 10,147,772 B2 | 12/2018 | Breedlove et al. |
| 2016/0046103 A1 | 2/2016 | Hong et al. |

FOREIGN PATENT DOCUMENTS

| | | |
|---|---|---|
| CN | 104070746 A | 10/2014 |
| CN | 105103100 A | 11/2015 |

(Continued)

*Primary Examiner* — Lawrence D Ferguson
(74) *Attorney, Agent, or Firm* — Slater Matsil, LLP

(57) ABSTRACT

In accordance with an embodiment, a screen cover plate includes: a first force-bearing plate and a second force-bearing plate, wherein the first force-bearing plate and the second force-bearing plate are disposed in a laminated manner, and both the first force-bearing plate and the second force-bearing plate are flexible transparent plates; and an optical adhesive layer located between the first force-bearing plate and the second force-bearing plate, and bonding the first force-bearing plate and the second force-bearing plate together, wherein a material of the optical adhesive layer is curable optical adhesive.

20 Claims, 3 Drawing Sheets

(51) Int. Cl.
  *B32B 37/12*          (2006.01)
  *G02F 1/1333*         (2006.01)
  *H10K 59/80*          (2023.01)
(52) U.S. Cl.
  CPC ... *B32B 2307/7376* (2023.05); *B32B 2457/20*
            (2013.01); *H10K 59/872* (2023.02)

(56)                    References Cited

FOREIGN PATENT DOCUMENTS

| CN | 109080239 | A |   | 12/2018 |
|----|-----------|---|---|---------|
| CN | 110317339 | A |   | 10/2019 |
| EP | 3272529   | A1 |  | 1/2018  |
| JP | 2010086510 | A |  | 4/2010  |
| JP | 2017141416 | A |  | 8/2017  |
| KR | 20200101574 | A | | 8/2020  |
| WO | WO 2020056599 | A1 | * | 3/2020 |

* cited by examiner

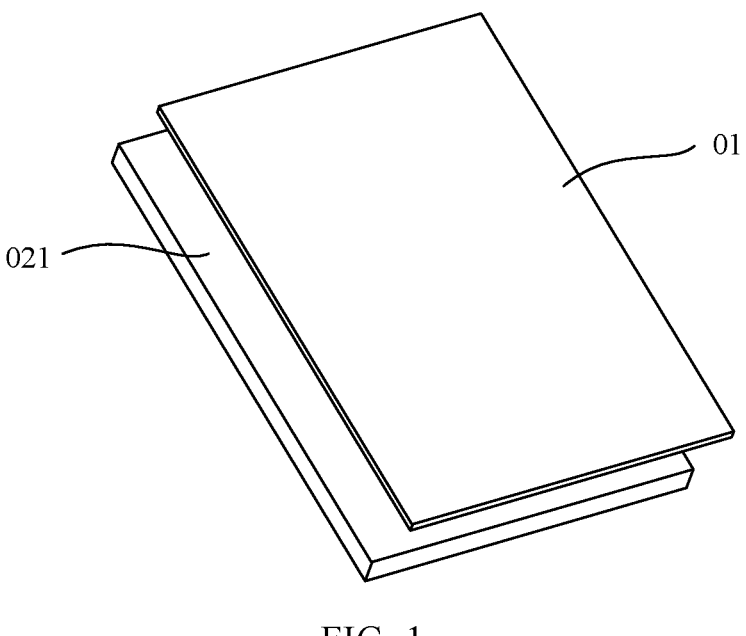
FIG. 1
01
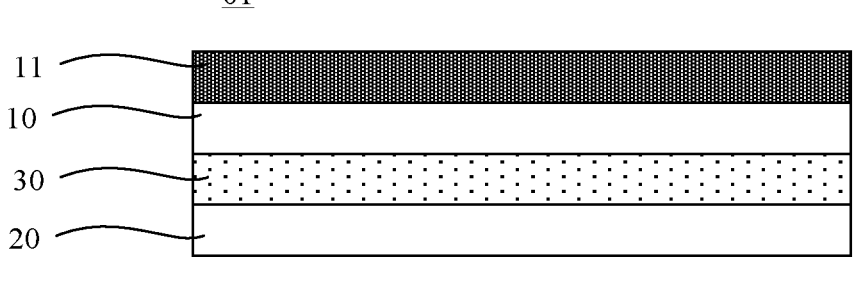
FIG. 2
01
FIG. 3

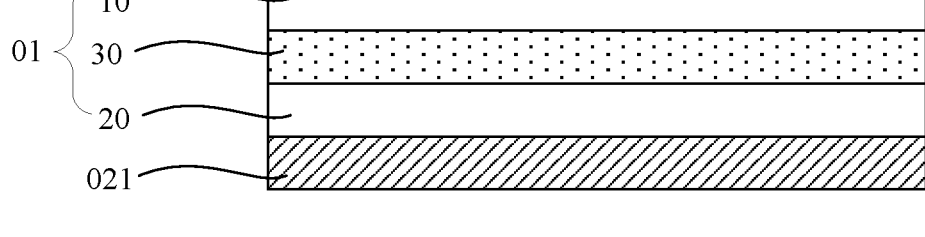
FIG. 4
FIG. 5
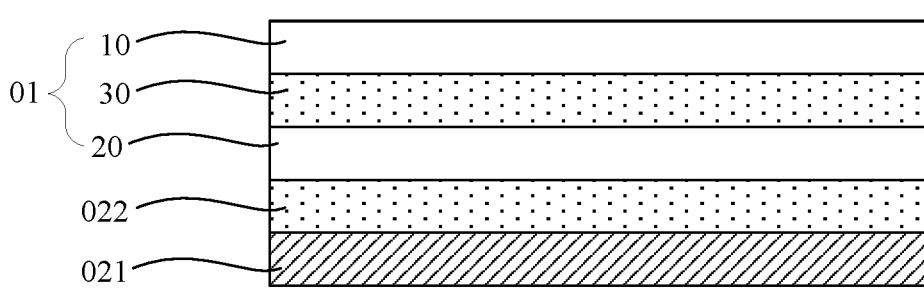
FIG. 6

SCREEN COVER PLATE, DISPLAY APPARATUS, AND ELECTRONIC DEVICE

CROSS-REFERENCE TO RELATED APPLICATIONS

This application is a continuation of International Application No. PCT/CN2020/132195, filed on Nov. 27, 2020, the disclosure of which is hereby incorporated by reference in its entirety.

TECHNICAL FIELD

This application relates to the field of electronic device technologies, and in particular, to a screen cover plate, a display apparatus, and an electronic device.

BACKGROUND

With development of display technologies, product quality and display effect of flexible screens (for example, OLED screens) are effectively improved. The flexible screens are gradually being widely used in electronic devices such as mobile phones, notebook computers, and displays due to features such as low power consumption and bendability. However, when a flexible screen is subject to external force (for example, strong pressing or falling), unfavorable conditions such as cracking may occur. Therefore, in an actual application, a screen cover plate needs to be disposed on an outer side surface (for example, a viewing side of a user) of the flexible screen to effectively protect the flexible screen.

Currently, a main material of the screen cover plate is glass, which has high rigidity and is not likely to be scratched, so that a display can be effectively protected. However, the screen cover plate of glass has poor bendability. When the screen cover plate is bent along with the flexible screen, the screen cover plate is likely to crack and even break. Therefore, the screen cover plate of glass cannot be well used for the flexible screen. Some manufacturers start to replace the screen cover plate of glass with a screen Therefore, the screen cover plate of the plastic material cannot effectively protect the flexible screen.

SUMMARY

Some embodiments of the present application relate to a screen cover plate with high rigidity, good bendability, and strong impact resistance performance, a display apparatus, and an electronic device.

According to one aspect, this application provides a screen cover plate, including a first force-bearing plate, a second force-bearing plate, and an optical adhesive layer. The first force-bearing plate, the optical adhesive layer, and the second force-bearing plate are disposed sequentially in a laminated manner. Specifically, the optical adhesive layer is located between the first force-bearing plate and the second force-bearing plate, and is used to bond the first force-bearing plate and the second force-bearing plate. Both the first force-bearing plate and the second force-bearing plate are flexible transparent plates, so that the first force-bearing plate and the second force-bearing plate have good bendability and light transmittance. In addition, the optical adhesive layer is a curable optical adhesive, so that the optical adhesive layer has good rigidity and can effectively weaken force transfer between the first force-bearing plate and the second force-bearing plate. For example, when the first force-bearing plate is pressed, a part of pressure is blocked, dampened, and absorbed by the first force-bearing plate. The rest of the pressure is transferred to the optical adhesive layer through bending deformation of the first force-bearing plate. Because the optical adhesive layer has good rigidity, the optical adhesive layer can resist external force through structural strength of the optical adhesive layer and weaken applied force transferred to the second force-bearing plate. That is, the screen cover plate uses a structural form of the first force-bearing plate, the optical adhesive layer, and the second force-bearing plate. This can effectively improve overall structural rigidity of the screen cover plate and further ensure bending performance of the screen cover plate.

$$\frac{E_{first\ force-bearing\ plate} * t_{first\ force-bearing\ plate} + E_{optical\ adhesive\ layer} * t_{optical\ adhesive\ layer} + E_{second\ force-bearing\ plate} * t_{second\ force-bearing\ plate}}{t_{first\ force-bearing\ plate} + t_{optical\ adhesive\ layer} + t_{second\ force-bearing\ plate}}$$

cover plate of a plastic material, for example, polyimide. Because the screen cover plate of the plastic material has good bendability, the screen cover plate can be well bent along with the flexible screen. However, the screen cover plate of the plastic material has low rigidity, and is likely to be scratched. Therefore, display effect of the flexible screen is reduced. In addition, when being subject to external force (for example, strong pressing by a hand), the screen cover plate of the plastic material is likely to deform, so that impact force is obviously transferred to the flexible screen.

In a specific implementation, the screen cover plate may satisfy the following relationship:

$$\frac{E_{first\ force-bearing\ plate} * t_{first\ force-bearing\ plate} + E_{optical\ adhesive\ layer} * t_{optical\ adhesive\ layer} + E_{second\ force-bearing\ plate} * t_{second\ force-bearing\ plate}}{t_{first\ force-bearing\ plate} + t_{optical\ adhesive\ layer} + t_{second\ force-bearing\ plate}}$$

$$E_{first\ force-bearing\ plate}.$$

$E_{first\ force-bearing\ plate}$ is a Young's modulus of the first force-bearing plate, $t_{first\ force-bearing\ plate}$ is the thickness of the first force-bearing plate, $E_{optical\ adhesive\ layer}$ is a Young's modulus of the optical adhesive layer, $t_{optical\ adhesive\ layer}$ is the thickness of the optical adhesive layer, $E_{second\ force-bearing\ plate}$ is a Young's modulus of the second force-bearing plate, and $t_{second\ force-bearing\ plate}$ is the thickness of the second force-bearing plate.

In a specific implementation, a material of the optical adhesive layer may be light-curable optical adhesive, heat-curable optical adhesive, or another type of curable optical adhesive. In a specific implementation, a curing process can be properly selected according to a curing type of the optical adhesive. For example, when the optical adhesive is the light-curable optical adhesive, the optical adhesive can be cured through an ultraviolet curing process. When the optical adhesive is the heat-curable optical adhesive, the optical adhesive can be cured through a heating process.

A specific material of the first force-bearing plate may be a flexible material with a high Young's modulus, for example, transparent polyimide (polyimide, PI). Certainly, in another implementation, the first force-bearing plate may also be made of another material. This is not limited in this application.

A specific material of the second force-bearing plate may be a flexible material with a high Young's modulus, for example, transparent polyimide or polyamide. Certainly, in another implementation, the second force-bearing plate may also be made of another material. This is not limited in this application.

Materials of the first force-bearing plate and the second force-bearing plate may be the same or different. In addition, during use, an outer side (a side away from the optical adhesive layer) of the first force-bearing plate can be used as a force-bearing surface. For example, after the screen cover plate is disposed over a display surface of a display panel, the first force-bearing plate is disposed away from the display panel compared with the second force-bearing plate, so that external force (for example, being pressed by a hand) first acts on the first force-bearing plate, and the display panel is protected effectively. Certainly, in a specific application, an outer side (a side away from the optical adhesive layer) of the second force-bearing plate can also be used as a force-bearing surface. This is not limited in this application.

Certainly, in a specific application, the thickness of the first force-bearing plate may be the same as or different from that of the second force-bearing plate. For example, when the outer side of the first force-bearing plate is used as the force-bearing surface, the thickness of the first force-bearing plate may be greater than that of the second force-bearing plate. When the first force-bearing plate is subject to the external force, effects of absorbing and dampening the external force can be effectively improved, and structural strength of the first force-bearing plate can also be effectively improved.

According to another aspect, this application further provides a display apparatus, including a display panel and the foregoing screen cover plate, where the screen cover plate is disposed over a display surface of the display panel.

In a specific application, the second force-bearing plate in the screen cover plate may be attached to the display surface of the display panel by using a bonding layer, to implement bonding between the display panel and the screen cover plate. To be specific, an upper plate surface of the first force-bearing plate can be used as a force-bearing surface, or as a surface which a hand touches.

In a specific implementation, the bonding layer may be made of a same material as the foregoing optical adhesive layer, or may be made of another material with good bonding effect and light transmittance. This is not limited in this application.

It can be understood that, in another implementation, the first force-bearing plate can also be bonded with the display surface of the display panel. In this case, a lower plate surface of the second force-bearing plate can be used as a force-bearing surface in use.

Certainly, in a specific application, the display panel and the second force-bearing plate can be bonded by using the bonding layer, or may be spaced apart.

In addition, the display panel may be a rigid display panel or a flexible display panel. For example, when the display panel is the rigid display panel, the display panel may be specifically a liquid crystal display panel or the like. When the display panel is the flexible display panel, the display panel may be specifically an OLED display panel or the like. A specific type of the display panel is not limited in this application.

According to still another aspect, this application further provides an electronic device, including a housing and the foregoing display apparatus. The display apparatus is mounted on the housing in a fastened manner. An accommodating cavity for accommodating electronic components such as a processor, a battery, and a circuit board is formed between the display apparatus and the housing.

In a specific implementation, the electronic device may be a tablet computer, a bar-type mobile phone, a foldable mobile phone, or the like. A type of the electronic device is not limited in this application.

BRIEF DESCRIPTION OF THE DRAWINGS

FIG. 1 is a schematic diagram of an application scenario of a screen cover plate according to an embodiment of this application;

FIG. 2 is a schematic diagram of a cross-sectional structure of a screen cover plate according to an embodiment of this application;

FIG. 3 is a schematic diagram of a cross-sectional structure of another screen cover plate according to an embodiment of this application;

FIG. 4 is a schematic diagram of a cross-sectional structure of a display apparatus according to an embodiment of this application;

FIG. 5 is a schematic diagram of a cross-sectional structure of another display apparatus according to an embodiment of this application;

FIG. 6 is a schematic diagram of a cross-sectional structure of a display apparatus according to an embodiment of this application;

DETAILED DESCRIPTION OF ILLUSTRATIVE EMBODIMENTS

Figure 7:
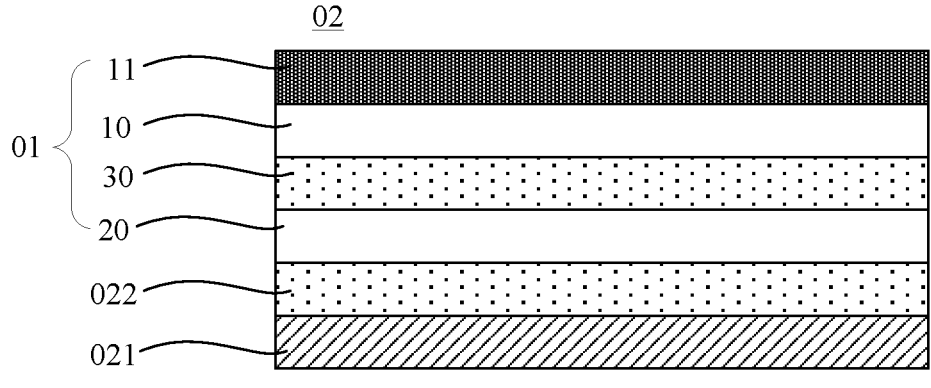
FIG. 7 is a schematic diagram of a cross-sectional structure of another display apparatus according to an embodiment of this application.

To make the objectives, technical solutions, and advantages of this application clearer, the following further describes this application in detail with reference to the accompanying drawings.

For ease of understanding a screen cover plate provided in embodiments of this application, the following first describes an application scenario of the screen cover plate.

As shown in FIG. 1, a screen cover plate 01 provided in this embodiment of this application may be used in a display panel 021 of a plurality of types such as a liquid crystal screen and a flexible screen (for example, an OLED screen).

In a specific application, the screen cover plate 01 may be disposed on a display side (for example, an upper side in the figure) of the display panel 021, to effectively protect the display panel 021 without affecting display effect of the display panel 021. In addition, because the screen cover plate 01 has good bendability, the screen cover plate 01 can be also properly used in the flexible screen.

To make objectives, technical solutions, and advantages of this application clearer, the following further describes this application in detail with reference to the accompanying drawings and specific embodiments.

Terms used in the following embodiments are merely intended to describe specific embodiments, but are not intended to limit this application. Terms "one", "a", "the foregoing", "the", and "the one" of singular forms used in this specification and the appended claims of this application are also intended to include plural forms like "one or more", unless otherwise specified in the context clearly. It should be further understood that in the following embodiments of this application, "at least one" and "one or more" mean one, two, or more. The term "and/or" is used to describe an association relationship between associated objects and represents that three relationships may exist. For example, "A and/or B" may represent the following cases: Only A exists, both A and B exist, and only B exists, where A and B may be singular or plural. The character "/" generally indicates an "or" relationship between the associated objects.

Reference to "an embodiment", "some embodiments", or the like described in this specification indicates that one or more embodiments of this application include a specific feature, structure, or characteristic described with reference to the embodiments. Therefore, statements such as "in an embodiment", "in some embodiments", "in some other embodiments", and "in other embodiments" that appear at different places in this specification do not necessarily mean referring to a same embodiment. Instead, the statements mean "one or more but not all of embodiments", unless otherwise specifically emphasized in another manner. The terms "include", "comprise", "have" and their variants mean "including but not limited to" unless specifically emphasized otherwise.

In some embodiments, a screen cover plate, a display apparatus, and an electronic device are provided, which relate to the field of electronic device technologies. The screen cover plate may include a first force-bearing plate, a second force-bearing plate, and an optical adhesive layer. The first force-bearing plate and the second force-bearing plate may be disposed in a laminated manner, and both the first force-bearing plate and the second force-bearing plate may be flexible transparent plates. The optical adhesive layer is located between the first force-bearing plate and the second force-bearing plate, and is used to bond the first force-bearing plate and the second force-bearing plate. A material of the optical adhesive layer may be curable optical adhesive. The screen cover plate (01) may be advantageously well adapted to a flexible display panel due to good bendability and rigidity. Moreover, the screen cover plate may exhibit a good anti-collision capability. This helps improve safety of the display panel. Some embodiments may to resolve a technical problem of poor use performance of the screen cover plate (01).

As shown in FIG. 2, in an embodiment provided in this application, a screen cover plate 01 includes a first force-bearing plate 10, a second force-bearing plate 20, and an optical adhesive layer 30. The first force-bearing plate 10, the optical adhesive layer 30, and the second force-bearing plate 20 are disposed sequentially in a laminated manner.

Specifically, the optical adhesive layer 30 is located between the first force-bearing plate 10 and the second force-bearing plate 20, and is used to bond the first force-bearing plate 10 and the second force-bearing plate 20. Both the first force-bearing plate 10 and the second force-bearing plate 20 may be flexible transparent plates, so that the first force-bearing plate 10 and the second force-bearing plate 20 have good bendability and light transmittance. When the screen cover plate 01 is disposed on a display side of a display panel (not shown in the figure), an image displayed on the display panel can efficiently penetrate through the screen cover plate 01, to provide good visual experience for a user. In addition, in the screen cover plate 01 provided in this application, the optical adhesive layer 30 may be curable optical adhesive, so that the optical adhesive layer 30 has good rigidity, and can effectively weaken force transfer between the first force-bearing plate 10 and the second force-bearing plate 20. For example, when the first force-bearing plate 10 is pressed, a part of pressure is blocked, dampened, and absorbed by the first force-bearing plate 10. Another part of the pressure is transferred to the optical adhesive layer 30 through bending deformation of the first force-bearing plate 10. Because the optical adhesive layer 30 has good rigidity, the optical adhesive layer 30 can resist external force through structural strength of the optical adhesive layer 30, and weaken applied force transferred to the second force-bearing plate 20. That is, the screen cover plate 01 uses a structural form of the first force-bearing plate 10, the optical adhesive layer 30, and the second force-bearing plate 20. This can effectively improve overall structural rigidity of the screen cover plate 01 and further ensure bending performance of the screen cover plate 01.

In a specific implementation, a material of the optical adhesive layer 30 may be light-curable optical adhesive, or may be heat-curable optical adhesive. Compared with non-hardenable optical adhesive, the curable optical adhesive used in this application enables the optical adhesive layer 30 to have a large Young's modulus, so that the optical adhesive layer 30 has high rigidity. Specifically, a Young's modulus of the non-curable optical adhesive is usually less than 0.001 GPa, while a Young's modulus of a cured optical adhesive is usually greater than 1 GPa. Therefore, compared with the Young' modulus of the non-curable optical adhesive, the Young' modulus of the cured optical adhesive is 1000 times greater, so that overall rigidity of the screen cover plate 01 can be effectively improved.

For example, the light-curable optical adhesive is optical adhesive that can generate curing effect through an ultra-violet curing process. The ultraviolet curing process is a process in which a photoinitiator in the optical adhesive is quickly decomposed into free radicals under ultraviolet radiation of a specific intensity and wavelength, thereby initiating a polymerization reaction of an unsaturated organic compound, and ultimately generating a cross-linked structural macromolecule. In terms of compositions, the light-curable optical adhesive may include the photoinitiator, an active diluent, and a prepolymer. The photoinitiator may be benzoin, benzoin ethyl ether, benzoin dimethyl ether, or the like. The active diluent has both dilution effect and crosslinking effect in the light-curable optical adhesive. The active diluent may be hydroxyethyl acrylate, hydroxypropyl methacrylate, or the like. The prepolymer may be acrylate, polyurethane acrylate, or the like.

It can be understood that, in a specific application, specific components of the light-curable optical adhesive and a ratio of the components can be adaptively selected and adjusted according to different requirements. This is not limited in this application.

For example, the heat-curable optical adhesive may be adhesive that uses a thermosetting resin containing reactive groups as a bonding material. Under a heating condition, liquid adhesive molecules can be further polymerized and crosslinked to form a cured structure. For material selection, the heat-curable optical adhesive may use materials such as a polyurethane resin, and melamine. In a specific application, specific components of the heat-curable optical adhesive and a ratio of the components may be adaptively selected and adjusted according to different requirements. This is not limited in this application.

In another implementation, the optical adhesive layer 30 may alternatively use another type of curable optical adhesive, and the optical adhesive is cured through a corresponding curing process. Therefore, the optical adhesive layer 30 provides good bonding effect for the first force-bearing plate 10 and the second force-bearing plate 20, and has good rigidity.

During manufacturing, the optical adhesive in a liquid state or a melted state may be disposed on an upper plate surface of the second force-bearing plate 20 through a coating process, a spraying process, or the like, to form the optical adhesive layer 30. Then, the first force-bearing plate 10 is placed on an upper side of the optical adhesive layer 30, so that a lower plate surface of the first force-bearing plate 10 is fully attached to the optical adhesive layer 30. Finally, the optical adhesive layer 30 is cured through an ultraviolet curing process or a heat curing process.

It can be understood that, in another embodiment, the optical adhesive layer 30 may be disposed on the lower plate surface of the first force-bearing plate 10. Alternatively, optical adhesive layers 30 are disposed on the lower plate surface of the first force-bearing plate 10 and the upper plate surface of the second force-bearing plate 20. Then, the first force-bearing plate 10 and the second force-bearing plate 20 are bonded.

In addition, during specific manufacturing, the first force-bearing plate 10 and the second force-bearing plate 20 may be first cut to a required shape (for example, a rectangle). Then, the first force-bearing plate 10 and the second force-bearing plate 20 are bonded by using the optical adhesive. Alternatively, large areas of the first force-bearing plate 10 and the second force-bearing plate 20 are first bonded by using the optical adhesive, to form a preparation material. Then, the preparation material is cut according to an actual requirement, to prepare a screen cover plate 01 of a required shape and size.

It can be understood that a specific shape and contour, a manufacturing process, and a manufacturing sequence of the screen cover plate 01 are not limited in this application, and can be flexibly selected and adjusted based on an actual situation during manufacturing.

A specific material of the first force-bearing plate 10 may be a flexible material with a high Young's modulus, for example, transparent polyimide (polyimide, PI). A first force-bearing plate 10 made of the transparent polyimide has good light transmittance and bendability, and is not likely to crack when being subject to external force. This ensures overall rigidity and reliability of the screen cover plate 01.

A specific material of the second force-bearing plate 20 may be a flexible material with a high Young's modulus, for example, transparent polyimide or polyamide. A second force-bearing plate 20 made of the transparent polyimide has good light transmittance and bendability, and is not likely to crack when being subject to external force. This ensures overall rigidity and reliability of the screen cover plate 01. A second force-bearing plate 20 made of the polyamide has good light transmittance and bendability. In addition, compared with the second force-bearing plate 20 made of the transparent polyimide, the second force-bearing plate 20 made of the polyamide has a higher Young's modulus and can improve an overall Young's modulus of the screen cover plate 01 effectively. Therefore, the screen cover plate 01 has better rigidity. In addition, when the second force-bearing plate 20 is made of the polyamide, the second force-bearing plate 20 has the higher Young's modulus and is thus likely to crack when being subject to external force, compared with the first force-bearing plate 10. Therefore, in an embodiment provided in this application, an outer side surface of the first force-bearing plate 10 can be used as a force-bearing surface to preliminarily absorb and dampen the external force. This protects the second force-bearing plate 20 to some extent, and reduces risks such as cracking of the second force-bearing plate 20, effectively.

In a specific implementation, the first force-bearing plate 10 and the second force-bearing plate 20 can be made of a same material. For example, both the first force-bearing plate 10 and the second force-bearing plate 20 may be made of the transparent polyimide. An outer side (a side away from the optical adhesive layer 30) of the first force-bearing plate 10 can be used as a force-bearing surface of the screen cover plate 01. When the force-bearing surface is subject to external force (for example, pressing force or impact force), the first force-bearing plate 10 has specific rigidity, and thus can block the external force effectively. In addition, because the first force-bearing plate 10 further has specific flexibility, the first force-bearing plate 10 can dampen and absorb the external force through elastic deformation of the first force-bearing plate 10, so that force transferred to the optical adhesive layer 30 can be obviously reduced. When the external force is transferred to the optical adhesive layer 30 through the first force-bearing plate 10, the external force can be further blocked properly because the optical adhesive layer 30 has good rigidity. When the external force is transferred to the second force-bearing plate 20 through the optical adhesive layer 30, the external force can be blocked effectively because the second force-bearing plate 20 has specific rigidity. In addition, because the second force-bearing plate 20 further has specific flexibility, the second force-bearing plate 20 can dampen and absorb the external force through elastic deformation. To be specific, the first force-bearing plate 10, the optical adhesive layer 30, and the second force-bearing plate 20 can block, dampen, and absorb the external force level by level. This can effectively avoid a case in which structures of the first force-bearing plate 10, the optical adhesive layer 30, and the second force-bearing plate 20 are damaged by the external force.

It can be understood that, when the first force-bearing plate 10 and the second force-bearing plate 20 are made of a same material, the thickness of the first force-bearing plate 10 and the thickness of the second force-bearing plate 20 may be the same or different.

For example, the thickness of the first force-bearing plate 10 may be greater than the thickness of the second force-bearing plate 20. Because the external force first acts on the first force-bearing plate 10, force-bearing performance and capabilities of the first force-bearing plate 10 for dampening and absorbing the external force can be improved by increasing the thickness of the first force-bearing plate 10.

Certainly, in another implementation, the thickness of the second force-bearing plate 20 may be greater than or equal to the thickness of the second force-bearing plate 20. This is not limited in this application. Alternatively, in actual use, an outer side (a side away from the optical adhesive layer 30)

plate 10 and the thickness of the second force-bearing plate 20 may be the same or different. This is not limited in this application.

$$\frac{E_{first\ force-bearing\ plate}*t_{first\ force-bearing\ plate}+E_{optical\ adhesive\ layer}*t_{optical\ adhesive\ layer}+E_{second\ force-bearing\ plate}*t_{second\ force-bearing\ plate}}{t_{first\ force-bearing\ plate}+t_{optical\ adhesive\ layer}+t_{second\ force-bearing\ plate}}$$

10 of the second force-bearing plate 20 can also be used as a force-bearing surface of the screen cover plate 01.

In addition, in some implementations, the first force-bearing plate 10 and the second force-bearing plate 20 may also be made of different materials. For example, the first force-bearing plate 10 may be made of transparent polyimide, and the second force-bearing plate 20 may be made of polyamide. When the first force-bearing plate 10 is compared with the second force-bearing plate 20, the first force-bearing plate 10 has better flexibility and can better dampen and absorb the external force. The second force-bearing plate 20 has a higher Young's modulus and thus has In the screen cover plate 01 provided in this application, the first force-bearing plate 10, the second force-bearing plate 20, and the optical adhesive layer 30 are combined, so that an overall Young's modulus of the screen cover plate 01 can be effectively increased. For example, when the first force-bearing plate 10 is made of polyimide, the second force-bearing plate 20 is made of polyamide, and the optical adhesive layer 30 is made of curable optical adhesive, the screen cover plate 01 can satisfy the following formula requirement:

$$\frac{E_{first\ force-bearing\ plate}*t_{first\ force-bearing\ plate}+E_{optical\ adhesive\ layer}*t_{optical\ adhesive\ layer}+E_{second\ force-bearing\ plate}*t_{second\ force-bearing\ plate}}{t_{first\ force-bearing\ plate}+t_{optical\ adhesive\ layer}+t_{second\ force-bearing\ plate}}$$

$$E_{first\ force-bearing\ plate}.$$

better rigidity. Therefore, the second force-bearing plate 20 is less likely to deform when being subject to external force, so that transfer of the external force can be better blocked. Alternatively, it can be understood that, when being subject to the external force, the first force-bearing plate 10 has lower rigidity and thus can effectively dampen the external force through elastic deformation of the first force-bearing plate 10. Therefore, cases such as cracking are less likely to occur. Therefore, in actual use, the outer side (the side away from the optical adhesive layer 30) of the first force-bearing plate 10 can be used as the force-bearing surface. When the outer side of the first force-bearing plate 10 is subject to the external force (for example, the pressing force or the impact force), the first force-bearing plate 10 has specific rigidity, and thus can block the external force effectively. In addition, because the first force-bearing plate 10 further has a specific flexibility, the first force-bearing plate 10 can dampen and absorb the external force through elastic deformation of the first force-bearing plate 10. This can obviously reduce force transferred to the optical adhesive layer 30 and ensures safety of the first force-bearing plate 10. When the external force is transferred to the optical adhesive layer 30 through the first force-bearing plate 10, the external force can be further blocked properly because the optical adhesive layer 30 has good rigidity. When the external force is transferred to the second force-bearing plate 20 through the optical adhesive layer 30, the external force can be blocked effectively because the second force-bearing plate 20 has good rigidity. To be specific, the first force-bearing plate 10, the optical adhesive layer 30, and the second force-bearing plate 20 can block, dampen, and absorb the external force level by level. This can effectively avoid a case in which structures of the first force-bearing plate 10, the optical adhesive layer 30, and the second force-bearing plate 20 are damaged by the external force.

It can be understood that, when the first force-bearing plate 10 and the second force-bearing plate 20 are made of different materials, the thickness of the first force-bearing $E_{first\ force-bearing\ plate}$ represents a Young's modulus of the first force-bearing plate 10, $t_{first\ force-bearing\ plate}$ represents the thickness of the first force-bearing plate 10, $E_{optical\ adhesive\ layer}$ represents a Young's modulus of the optical adhesive layer 30, $t_{optical\ adhesive\ layer}$ represents the thickness of the optical adhesive layer 30, $E_{second\ force-bearing\ plate}$ represents a Young's modulus of the second force-bearing plate 20, and $t_{second\ force-bearing\ plate}$ represents the thickness of the second force-bearing plate 20.

It can be learned that the first force-bearing plate 10, the second force-bearing plate 20, and the optical adhesive layer 30 are combined, so that the overall Young's modulus of the screen cover plate 01 can be effectively increased.

In addition, in actual use, the outer side (the side away from the optical adhesive layer 30) of the second force-bearing plate 20 can also be used as the force-bearing surface of the screen cover plate 01.

Certainly, in an actual application, the screen cover plate 01 is not limited to including only the first force-bearing plate 10, the optical adhesive layer 30, and the second force-bearing plate 20. For example, the screen cover plate 01 may also include two or more first force-bearing plates 10 and second force-bearing plates 20 that are disposed in a laminated manner. The force-bearing plates that are disposed adjacent to each other in a laminated manner may be bonded by using curable optical adhesive, or may be bonded by using non-curable optical adhesive.

Alternatively, in some implementations, the outer side surface of the first force-bearing plate 10 or the second force-bearing plate 20 may be hardened, to improve a scratch resistance capability of the first force-bearing plate 10 or the second force-bearing plate 20.

For example, as shown in FIG. 3, in an embodiment provided in this application, a hardened coating 11 may be further disposed on the upper plate surface of the first force-bearing plate 10. A specific material of the hardened coating 11 may be acrylate, silane, or the like.

During manufacturing, the first force-bearing plate 10 can be hardened through spraying, immersing, or another process, to form the hardened coating 11 on the upper plate surface of the first force-bearing plate 10.

Certainly, in another implementation, when the lower plate surface of the second force-bearing plate 20 is used as the force-bearing surface, the hardened coating 11 may be disposed on the lower plate surface of the second force-bearing plate 20, to improve the scratch resistance capability of the second force-bearing plate 20.

It can be understood that during a specific implementation, a material, the thickness, and a preparation process of the hardened coating 11 may be flexibly selected and adjusted. This is not limited in this application.

In addition, in a specific application, the screen cover plate 01 may be used in a plurality of different types of display panels, to protect the display panels well.

In a specific implementation, the thickness of the hardened coating 11 may be between 1 micrometer to 20 micrometers, the thickness of the first force-bearing plate 10 may be between 20 micrometers to 100 micrometers, the thickness of the optical adhesive layer 30 may be between 0.1 micrometer to 10 micrometers, and the thickness of the first force-bearing plate 10 may be between 20 micrometers to 100 micrometers. It can be understood that during a specific implementation, the overall thickness of the screen cover plate 01 and the thicknesses of all components may be flexibly set. This is not limited in this application.

For example, as shown in FIG. 4, an embodiment of this application further provides a display apparatus 02, including a display panel 021 and a screen cover plate 01. The screen cover plate 01 is disposed over a display surface of the display panel 021.

Specifically, the screen cover plate 01 may be directly disposed on a display side (an upper side in the figure) of the display panel 021. To be specific, an upper plate surface of the first force-bearing plate 10 may be used as a force-bearing surface, or used as a surface which a hand touches.

In addition, as shown in FIG. 5, during a specific implementation, a hardened coating 11 may be further disposed on the upper plate surface of the first force-bearing plate 10, to improve a scratch resistance capability of the first force-bearing plate 10.

In a specific implementation, the screen cover plate 01 can be directly disposed outside a display surface of a display panel 021, or can be bonded and fastened to the display surface of the display panel 021.

For example, as shown in FIG. 6, the second force-bearing plate 20 in the screen cover plate 01 may be attached to the display surface of the display panel 021 by using a bonding layer 022, to implement bonding between the display panel 021 and the screen cover plate 01. To be specific, the upper plate surface of the first force-bearing plate 10 can be used as a force-bearing surface, or used as a surface which a hand touches.

In a specific implementation, the bonding layer 022 may be made of a same material as the foregoing optical adhesive layer 30, or may be made of another material with good bonding effect and light transmittance. This is not limited in this application.

In addition, as shown in FIG. 7, in a specific implementation, a hardened coating 11 may be further disposed on the upper surface of the first force-bearing plate 10, to improve a scratch resistance capability of the first force-bearing plate 10.

It can be understood that, in another implementation, the first force-bearing plate 10 can also be bonded with the display surface of the display panel 021. In this case, the lower plate surface of the second force-bearing plate 20 can be used as a force-bearing surface.

Certainly, in a specific application, the display panel 021 and the second force-bearing plate 20 may be bonded by using the bonding layer 022, or can be disposed at intervals or bonded directly.

In addition, the display panel 021 may be a rigid display panel 021 or a flexible display panel 021. For example, when the display panel 021 is the rigid display panel 021, the display panel 021 may be specifically a liquid crystal display panel 021 or the like. When the display panel 021 is the flexible display panel 021, the display panel 021 may be specifically an OLED display panel 021 or the like. A specific type of the display panel 021 is not limited in this application.

Figure 8:
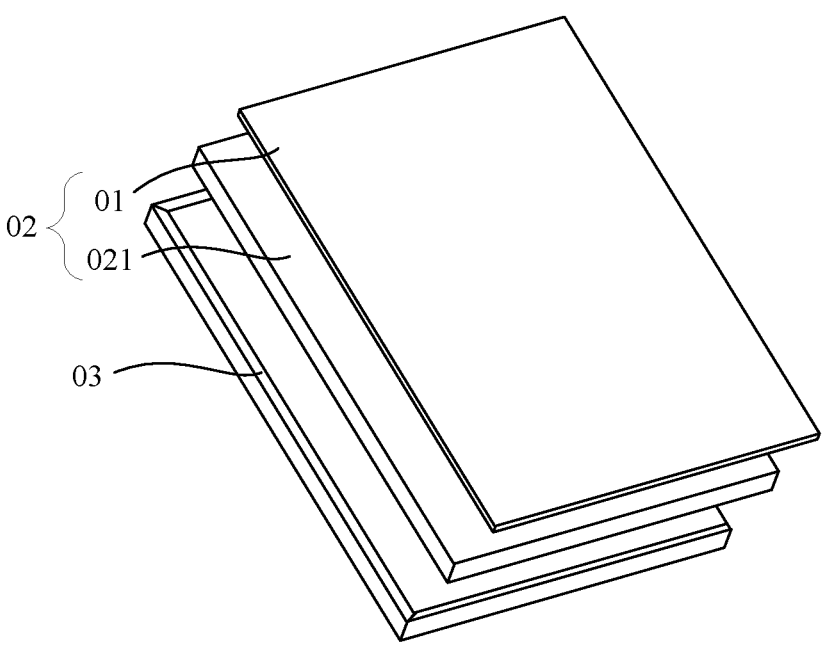
FIG. 8 is a schematic diagram of an exploded structure of an electronic device according to an embodiment of this application.

In addition, as shown in FIG. 8, an embodiment of this application further provides an electronic device. Specifically, the electronic device shown in the figure is a foldable mobile phone. The apparatus includes a housing 03 and the display apparatus 02. The display apparatus 02 is mounted in the housing 03 in a fastened manner, and an accommodating cavity (not shown in the figure) used to accommodate electronic components such as a processor, a battery, and a circuit board is formed between the display apparatus 02 and the housing 03.

In a specific implementation, the electronic device may be a device with a touchscreen function, such as a tablet computer, a bar-type mobile phone, a foldable mobile phone, or a smart screen. A type of the electronic device is not limited in this application.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A screen cover plate, comprising:

a first force-bearing plate and a second force-bearing plate, wherein the first force-bearing plate and the second force-bearing plate are disposed in a laminated manner, and both the first force-bearing plate and the second force-bearing plate are flexible transparent plates; and an optical adhesive layer located between the first force-bearing plate and the second force-bearing plate, wherein the first force-bearing plate and the second force-bearing plate are bonded together via the optical adhesive layer, and a material of the optical adhesive layer is curable optical adhesive, wherein the screen cover plate satisfies the following relationship:

$$\frac{E_{first\ force\text{-}bearing\ plate} * t_{first\ force\text{-}bearing\ plate} + E_{optical\ adhesive\ layer} * t_{optical\ adhesive\ layer} + E_{second\ force\text{-}bearing\ plate} * t_{second\ force\text{-}bearing\ plate}}{t_{first\ force\text{-}bearing\ plate} + t_{optical\ adhesive\ layer} + t_{second\ force\text{-}bearing\ plate}} > E_{first\ force\text{-}bearing\ plate},$$

wherein $E_{first\ force\text{-}bearing\ plate}$ is a Young's modulus of the first force-bearing plate;

adhesive layer, and a material of the optical adhesive layer is curable optical adhesive, wherein the screen cover plate satisfies the following relationship:

$$\frac{E_{first\ force\text{-}bearing\ plate} * t_{first\ force\text{-}bearing\ plate} + E_{optical\ adhesive\ layer} * t_{optical\ adhesive\ layer} + E_{second\ force\text{-}bearing\ plate} * t_{second\ force\text{-}bearing\ plate}}{t_{first\ force\text{-}bearing\ plate} + t_{optical\ adhesive\ layer} + t_{second\ force\text{-}bearing\ plate}} > E_{first\ force\text{-}bearing\ plate},$$

$t_{first\ force\text{-}bearing\ plate}$ is a thickness of the first force-bearing plate;

$E_{optical\ adhesive\ layer}$ is a Young's modulus of the optical adhesive layer;

$t_{optical\ adhesive\ layer}$ is a thickness of the optical adhesive layer;

$E_{second\ force\text{-}bearing\ plate}$ is a Young's modulus of the second force-bearing plate; and $t_{second\ force\text{-}bearing\ plate}$ is a thickness of the second force-bearing plate.

2. The screen cover plate according to claim 1, wherein the material of the optical adhesive layer is light-curable optical adhesive or heat-curable optical adhesive.

3. The screen cover plate according to claim 1, wherein a material of the first force-bearing plate is polyimide.

4. The screen cover plate according to claim 1, wherein a material of the second force-bearing plate is polyimide or polyamide.

5. The screen cover plate according to claim 1, wherein the screen cover plate further comprises a hardened coating located on a plate surface of the first force-bearing plate facing away from the optical adhesive layer.

6. The screen cover plate according to claim 5, wherein a material of the hardened coating is acrylate or silane.

7. The screen cover plate according to claim 1, wherein a flexibility of the first force-bearing plate is greater than or equal to a flexibility of the second force-bearing plate.

8. The screen cover plate according to claim 1, wherein the thickness of the first force-bearing plate is less than or equal to the thickness of the second force-bearing plate.

9. A display apparatus, comprising:
   a display panel; and
   a screen cover plate disposed on a display surface of the display panel, the screen cover plate comprising:
   a first force-bearing plate and a second force-bearing plate, wherein the first force-bearing plate and the second force-bearing plate are disposed in a laminated manner, both the first force-bearing plate and the second force-bearing plate are flexible transparent plates, and the first force-bearing plate is disposed further away from the display panel than the second force-bearing plate,
   an optical adhesive layer located between the first force-bearing plate and the second force-bearing plate, wherein the first force-bearing plate and the second force-bearing plate are bonded together via the optical wherein $E_{first\ force\text{-}bearing\ plate}$ is a Young's modulus of the first force-bearing plate;

$t_{first\ force\text{-}bearing\ plate}$ is a thickness of the first force-bearing plate;

$E_{optical\ adhesive\ layer}$ is a Young's modulus of the optical adhesive layer;

$t_{optical\ adhesive\ layer}$ is a thickness of the optical adhesive layer;

$E_{second\ force\text{-}bearing\ plate}$ is a Young's modulus of the second force-bearing plate; and $t_{second\ force\text{-}bearing\ plate}$ is a thickness of the second force-bearing plate.

10. The display apparatus according to claim 9, wherein the material of the optical adhesive layer is light-curable optical adhesive or heat-curable optical adhesive.

11. The display apparatus according to claim 10, wherein:
    a material of the first force-bearing plate is polyimide; and
    a material of the second force-bearing plate is polyimide or polyamide.

12. The display apparatus according to claim 10, wherein the screen cover plate further comprises a hardened coating located on a plate surface of the first force-bearing plate facing away from the optical adhesive layer.

13. The display apparatus according to claim 12, wherein a material of the hardened coating is acrylate or silane.

14. The display apparatus according to claim 10, wherein a flexibility of the first force-bearing plate is greater than or equal to a flexibility of the second force-bearing plate.

15. The display apparatus according to claim 10, wherein the thickness of the first force-bearing plate is less than or equal to the thickness of the second force-bearing plate.

16. The display apparatus according to claim 10, further comprising a bonding layer between the display panel and the second force-bearing plate.

17. An electronic device, comprising a housing and the display apparatus according to claim 9, wherein the display apparatus is mounted in the housing in a fastened manner.

18. A method, comprising:
    adhering a first force-bearing plate to a second force-bearing plate using an optical adhesive layer to form a screen cover plate in which the first force-bearing plate and the second force-bearing plate are disposed in a laminated manner, wherein the first force-bearing plate and the second force-bearing plate are flexible transparent plates; and adhering the second force-bearing plate to a surface of a display using a curable optical adhesive to form the optical adhesive layer located between the first force-bearing plate and the second force-bearing plate, such that the first force-bearing plate and the second force-bearing plate are bonded together via the optical adhesive layer, wherein the screen cover plate satisfies the following relationship:

$$\frac{E_{first\ force-bearing\ plate} * t_{first\ force-bearing\ plate} + E_{optical\ adhesive\ layer} * t_{optical\ adhesive\ layer} + E_{second\ force-bearing\ plate} * t_{second\ force-bearing\ plate}}{t_{first\ force-bearing\ plate} + t_{optical\ adhesive\ layer} + t_{second\ force-bearing\ plate}} > E_{first\ force-bearing\ plate},$$

wherein $E_{first\ force-bearing\ plate}$ is a Young's modulus of the first force-bearing plate;

$t_{first\ force-bearing\ plate}$ is a thickness of the first force-bearing plate;

$E_{optical\ adhesive\ layer}$ is a Young's modulus of the optical adhesive layer;

$t_{optical\ adhesive\ layer}$ is a thickness of the optical adhesive layer;

$E_{second\ force-bearing\ plate}$ is a Young's modulus of the second force-bearing plate; and $t_{second\ force-bearing\ plate}$ is a thickness of the second force-bearing plate.

19. The method of claim 18, wherein a flexibility of the first force-bearing plate is greater than or equal to a flexibility of the second force-bearing plate.

20. The method of claim 18, wherein a material of the optical adhesive layer is light-curable optical adhesive or heat-curable optical adhesive.

* * * * *